(12) United States Patent
Okuyama (10) Patent No.: US 7,535,546 B2
(45) Date of Patent: May 19, 2009

(54) LIQUID DROPLET DISCHARGING METHOD, AND LIQUID DROPLET DISCHARGING APPARATUS

(75) Inventor: Masayuki Okuyama, Suwa (JP)

(73) Assignee: Seiko Epson Corporation (JP)

( * ) Notice: Subject to any disclaimer, the term of this patent is extended or adjusted under 35 U.S.C. 154(b) by 570 days.

(21) Appl. No.: 11/274,767

(22) Filed: Nov. 15, 2005

(65) Prior Publication Data

US 2006/0061726 A1    Mar. 23, 2006

Related U.S. Application Data

(63) Continuation of application No. 10/844,972, filed on May 13, 2004, now Pat. No. 6,992,746.

(30) Foreign Application Priority Data

May 14, 2003   (JP) .............................. 2003-135791

(51) Int. Cl.
    *G02F 1/13*       (2006.01)
(52) U.S. Cl. .................................................... 349/187
(58) Field of Classification Search ................. 349/106, 349/187
    See application file for complete search history.

(56) References Cited

U.S. PATENT DOCUMENTS

| | | | |
|---|---|---|---|
| 6,165,406 A | 12/2000 | Jang et al. | |
| 6,619,793 B2 | 9/2003 | Yamazaki et al. | |
| 6,808,257 B2 | 10/2004 | Yamazaki et al. | |
| 6,969,167 B2 | 11/2005 | Yamazaki et al. | |
| 7,270,528 B2 * | 9/2007 | Sherwood ................. | 425/174.4 |
| 7,336,391 B2 * | 2/2008 | Okuyama .................... | 358/1.8 |
| 2003/0063251 A1 | 4/2003 | Murata et al. ............... | 349/189 |
| 2004/0145858 A1 * | 7/2004 | Sakurada ..................... | 361/600 |
| 2004/0151978 A1 | 8/2004 | Huang ......................... | 429/83 |
| 2004/0207800 A1 | 10/2004 | Hiruma et al. .............. | 349/189 |
| 2005/0198602 A1 * | 9/2005 | Brankner ...................... | 716/8 |

(Continued)

FOREIGN PATENT DOCUMENTS

JP    02-0173703    7/1990

(Continued)

OTHER PUBLICATIONS

*AutoCAD,* Microcomputer Applications, vol. 15, No. 10, 1999, pp. 64 and 34 (and English translation thereof).

(Continued)

*Primary Examiner*—James A Dudek
(74) *Attorney, Agent, or Firm*—Harness, Dickey & Pierce, P.L.C.

(57) ABSTRACT

A liquid droplet discharging method of the present invention forms a pattern on a substrate by discharging liquid droplets on the substrate from a discharging head having a liquid droplet discharging device, and moving the discharging head and the substrate relatively, and includes the steps of: preparing CAD data specified by a combination of a plurality of vector data; preparing bitmap data including an XY-matrix in which discharging positions of the liquid droplets are specified based on the CAD data; preparing liquid droplet discharging data for discharging of the liquid droplets based on the bitmap data; and forming the pattern by driving the liquid droplet discharging device based on the liquid droplet discharging data.

8 Claims, 7 Drawing Sheets

U.S. PATENT DOCUMENTS

2005/0253308 A1 * 11/2005 Sherwood ................... 264/497

FOREIGN PATENT DOCUMENTS

| | | |
|---|---|---|
| JP | 08-236902 | 9/1996 |
| JP | 09-008436 | 1/1997 |
| JP | 09-027900 | 1/1997 |
| JP | 09-309212 | 12/1997 |
| JP | 10-112585 | 4/1998 |
| JP | 2000-238249 | 9/2000 |
| JP | 2000-263875 | 9/2000 |
| JP | 2002-283249 | 9/2000 |
| JP | 2000-280357 | 10/2000 |
| JP | 2000-311527 | 11/2000 |
| JP | 2000-351211 | 12/2000 |
| JP | 2001-016440 | 1/2001 |
| JP | 2002-19260 | 1/2002 |
| JP | 2002-140982 | 5/2002 |
| JP | 2002-178534 | 6/2002 |
| JP | 2002-273869 | 9/2002 |
| JP | 2003-127392 | 5/2003 |

OTHER PUBLICATIONS

*AutoCAD Protel,* 1998, pp. 41-40 (and English translation thereof).
Communication from Chinese Patent Office re: related application. Feb. 2006.
Auto CAD, Microcomputer Applications, vol. 15, No. 10, 1999, pp. 64 and 34.
AutoCAD Protel, 1998, pp. 41, 40.
Communication from Japanese Patent Office re: related application. Apr. 2006.
Communication from Korean Patent Office re: related application. Feb. 2006.

* cited by examiner

LIQUID DROPLET DISCHARGING METHOD, AND LIQUID DROPLET DISCHARGING APPARATUS

BACKGROUND OF THE INVENTION

1. Field of the Invention

The present invention relates to a liquid droplet discharging method and to a liquid droplet discharging apparatus.

Priority is claimed on Japanese Patent Application No. 2003-135791, filed May 14, 2003, the contents of which are incorporated herein by reference.

2. Description of Related Art

In recent years, liquid crystal devices, electroluminescence devices and the like have been used for the display unit of electronic equipment such as mobile telephones and portable computers. For example, in a liquid crystal device, a color filter is formed by arranging dot-shaped filter elements of the respective colors of red, green, and blue in a predetermined pattern such as a stripe pattern, a delta pattern, or a mosaic pattern on a surface of a substrate formed from glass, plastic or the like.

A method of forming this type of color filter is known in which, while a dye droplet discharging head, which discharges liquid droplets of red, green, and blue dyes is being scanned, liquid droplets are discharged onto an acrylic resin that has been coated onto a glass substrate, so as to adhere thereto (for example, see Japanese Unexamined Patent Application, First Publication No. H02-173703).

Note that, because it is necessary for the respective liquid droplets to be adhered to positions on the substrate that are determined in advance, when a large number of color filters are being formed on a substrate having a large surface area, a mechanism that can precisely adjust the positions of the substrates has been required. In particular, in the case of a color filter that is formed in a minute pattern on a substrate, or in the case of a circuit having a complex pattern or the like, it is necessary to provide an adjustment mechanism having a high degree of precision. Furthermore, if time is needed in order to drive the mechanism for adjusting the position of a substrate, the tact time for each single substrate is lengthened.

The present invention was conceived in view of the above described drawbacks, and it is an object thereof to provide a liquid droplet discharging method and a liquid droplet discharging apparatus that enable an extremely precise pattern to be formed on a substrate using a simple structure.

SUMMARY OF THE INVENTION

A liquid droplet discharging method according to the present invention includes steps of: preparing computer aided design (CAD) data that is specified by a combination of a plurality of vector data, in accordance with a configuration of a pattern that is formed by discharging a liquid droplet from a liquid droplet discharging device onto a substrate; preparing bitmap data that specifies discharging positions of the liquid droplet using an XY matrix based on the CAD data; preparing liquid droplet discharging data used for discharging the liquid droplet based on the bitmap data; and forming the pattern by driving the liquid droplet discharging device in accordance with the liquid droplet discharging data.

The "liquid droplet discharging device" has a function of changing the volume inside the discharging heads in accordance with a predetermined voltage waveform that is supplied to piezoelectric elements or the like, and discharging the liquid droplet that has been pressed in accordance with this. Note that the liquid droplet discharging device is not limited to an electromechanical converter that uses a piezoelectric element or the like, and, for example, a device that uses a thermoelectric converter as an energy generator may be used, or else continuous methods and electrostatic absorption methods such as pressure vibration types and electrification control types may be used.

The "liquid droplet discharging data" is data that is used for supplying the voltage waveform to the liquid droplet discharging device, namely, data used for controlling the discharge of the liquid droplet by the liquid droplet discharging device. Data used for moving the discharging head and the substrate relatively to each other is contained in this liquid droplet discharging data, namely, the liquid droplet discharging data is also used for determining the discharging position of the liquid droplets on the substrate. The data format of this liquid droplet discharging data is a time series data format formed using "0" and "1", and is stored in read only memory (ROM) or random access memory (RAM).

The "pattern" is formed by discharging a material that is capable of being discharged in droplet form onto predetermined positions on a substrate. The term "pattern" refers to pixel patterns of RGB color filters formed by red (R), green (G), and blue (B), circuit patterns having, for example, resistance, capacitance formed by a capacitative element such as a condenser, and inductance such as antennas and coils having a labyrinth structure, patterns having switching elements such as thin film transistors (TFT) having semiconductors and pixel electrodes that are connected to the switching elements and the like, and oriented film materials and liquid crystal materials that require localized discharges and the like. The term "switching element" refers to elements that are formed using a material that is capable of being discharged as a liquid droplet.

The "substrate" is the object of the liquid droplet discharge on which a pattern is formed by discharging the above described liquid droplet. A variety of materials may be used for the substrate. For example, if transparency is required a substrate such as glass or the like may be used, while if transparency is not required a metal substrate or the like may be used. There are no particular restrictions on the size of the substrate and, in the present invention in particular, the term "substrate" refers to a large size substrate in excess of one meter.

According to the present invention, by using a computer provided with a display section such as a monitor and an input section such as a keyboard, it is possible to prepare in advance as CAD data a pattern formed by the above described discharge of a liquid droplet.

Moreover, it is possible to prepare bitmap data by converting the CAD data that has been prepared in this way.

After the liquid droplet discharging data has been prepared based on this bitmap data, by then making a discharge from a discharging head onto a predetermined position on the substrate based on the liquid droplet discharging data, it is possible to form a pattern on the substrate.

It is possible that: the pattern is formed by laminating a plurality of functional layers each having predetermined functions; the CAD data has a plurality of layer data that correspond to the functional layers; the bitmap data are prepared based on the plurality of layer data; the plurality of liquid droplet discharging data is prepared based on the plurality of bitmap data; and the pattern, which is formed by the plurality of functional layers, is formed by driving the liquid droplet discharging apparatus in accordance with the plurality of liquid droplet discharging data.

The term "functional layers" refers to each of the layers that make up the pattern, and refers, for example, to each layer of the aforementioned inductance, capacitance, resistance, switching elements, and the like. Namely, the above described pattern is formed by laminating each of these functional layers.

The "layer data" is prepared in advance on a computer or the like that is used for forming the aforementioned functional layers.

When the above described method is used, it is possible to prepare a plurality of bitmap data based on a plurality of layer data. In addition, it is possible to prepare a plurality of liquid droplet discharging data based on this plurality of bitmap data. Furthermore, by discharging liquid droplet based on this plurality of liquid droplet discharging data, it is possible to form a plurality of functional layers. Accordingly, it is possible to form a pattern in which a plurality of functional layers have been laminated.

It is possible that: a discharging head group that is formed by a plurality of the discharging heads is provided; and the pattern is formed by making the discharging heads of the discharging head group discharge the liquid droplet independently for each of the plurality of functional layers.

Here, a description is given of when the discharging head group has, for example, a first discharging head that discharges liquid droplet containing a metal material, a second discharging head that discharges liquid droplet containing an insulating film material, and a third discharging head that discharges liquid droplet containing a transparent electrode material. Firstly, when forming a functional layer that is made up of metal wiring on a substrate, bitmap data is prepared from layer data that is used for forming the metal wiring. Next, liquid droplet discharging data is prepared, and the first discharging head discharges liquid droplet containing a metal material based on this liquid droplet discharging data. Next, when forming the functional layers of the insulating film and transparent electrode, in the same way as is described above, groups of liquid droplet discharging data are prepared from layer data that is used for forming the insulating film and the transparent electrode. Based on these groups of data, the second discharging head then discharges liquid droplet containing insulating film material, and the third discharging head discharges liquid droplet containing transparent electrode material.

When the discharging head group is provided with the first, the second, and the third discharging head, and separate discharges of liquid droplet are made using these discharging heads, it is possible to form a pattern that is made up of a plurality of functional layers.

It is possible that: a plurality of liquid droplet discharging units each including the discharging heads that form the functional layers on the substrate by discharging the liquid droplet onto the substrate; and the pattern that is formed by the plurality of functional layers, is formed by making each of the plurality of liquid droplet discharging units discharge the liquid droplet independently for each of the plurality of functional layers.

Here, a description is given of when a pattern is formed using, for example, a first liquid droplet discharging unit that discharges liquid droplet containing a metal material, a second liquid droplet discharging unit that discharges liquid droplet containing an insulating film material, and a third liquid droplet discharging unit that discharges liquid droplet containing a transparent electrode material. Firstly, when forming a functional layer that is made up of metal wiring on a substrate, bitmap data is prepared from layer data that is used for forming the metal wiring. Next, liquid droplet discharging data is prepared, and liquid droplet containing a metal material is discharged onto the substrate by the first liquid droplet discharging unit based on this liquid droplet discharging data. Next, when forming the functional layers of the insulating film and transparent electrode, in the same way as is described above, groups of liquid droplet discharging data are prepared from layer data that is used for forming the insulating film and the transparent electrode. Based on these groups of data, liquid droplet containing insulating film material is then discharged by the second liquid droplet discharging unit, and liquid droplet containing transparent electrode material is discharged by the third liquid droplet discharging unit. It is preferable that a transporting unit for transporting a substrate is placed between each of the first, second, and third liquid droplet discharging units.

In this way, when separate discharges of liquid droplet are made using the first, second, and third liquid droplet discharging units, it is possible to form a pattern that is made up of a plurality of functional layers.

It is possible that: the layer data includes film thickness data that specifies film thicknesses of the functional layers; and a number of discharges of the liquid droplet that is discharged from the discharging heads and a discharging quantity of the liquid droplet are set based on the film thickness data.

The term "film thickness data" refers to the film thickness of the material that constitutes the functional layers. For example, when forming metal wiring or the like, a method is employed in which a liquid that has been obtained by dispersing fine metal particles in a volatile solvent is discharged as liquid droplets. In this method, the number of discharges and the discharge quantities of the liquid droplet can be set after the content of the fine metal particles has been adjusted, and after changes in the nature and changes in the volume of the material that are caused by the drying processing and heat processing that are performed in order to precipitate out the fine metal particles have been adjusted.

If the above described method is employed, then it is possible to set the number of discharges of the liquid droplet and the discharge quantities of the liquid droplet by adjusting the content of material and the like contained in the liquid droplet that is further discharged based on the film thickness data.

A liquid droplet discharging apparatus of the present invention includes a computer aided design (CAD) data preparing device that prepares CAD data, which is specified by a combination of a plurality of vector data groups, in accordance with a configuration of a pattern that is formed by discharging a liquid droplet from a liquid droplet discharging device onto a substrate; and a preparing device that prepares bitmap data that specifies discharging positions of the liquid droplet using an XY matrix based on the CAD data; wherein the pattern is formed by driving the liquid droplet discharging device in accordance with the liquid droplet discharging data.

According to the present invention, it is possible to prepare in advance as CAD data a pattern that is formed by the discharge of liquid droplet using a CAD data preparing device. In addition, bitmap data can be prepared using a bitmap data preparing device. It is also possible to prepare liquid droplet discharging data based on this bitmap data using a preparing device. Furthermore, by discharging liquid droplet onto predetermined positions on a substrate from a discharging head based on this liquid droplet discharging data, it is possible to form a pattern on the substrate.

It is possible that: the pattern is formed by laminating a plurality of functional layers each having predetermined functions; the CAD data preparing device prepares a plurality of layer data that correspond to the plurality of functional layers; the bitmap data preparing device prepares the plurality of bitmap data based on the plurality of layer data; the preparing device prepares the plurality of liquid droplet discharging data based on the plurality of bitmap data; and the pattern, which is formed by the plurality of functional layers, is formed by driving the liquid droplet discharging device in accordance with the plurality of liquid droplet discharging data.

In this case, it is possible for the CAD data preparing device to prepare a plurality of layer data. It is also possible for the bitmap data preparing device to prepare a plurality of bitmap data based on the plurality of layer data. Furthermore, it is possible for the preparing device to prepare a plurality of liquid droplet discharging data based on the plurality of bitmap data. A plurality of functional layers can then be formed by discharging liquid droplet based on the plurality of liquid droplet discharging data. Accordingly, it is possible to form a pattern in which a plurality of functional layers are laminated.

It is possible that: a discharging head group formed by the plurality of discharging heads is provided; and the discharging head group discharges the liquid droplet independently for each of the plurality of functional layers.

Here, a description is given of when the discharging head group has, for example, a first discharging head that discharges liquid droplet containing a metal material, a second discharging head that discharges liquid droplet containing an insulating film material, and a third discharging head that discharges liquid droplet containing a transparent electrode material. Firstly, when forming a functional layer that is made up of metal wiring on a substrate, bitmap data is prepared from layer data that is used for forming the metal wiring. Next, liquid droplet discharging data is prepared, and the first discharging head discharges liquid droplet containing a metal material based on this liquid droplet discharging data. Next, when forming the functional layers of the insulating film and transparent electrode, in the same way as is described above, groups of liquid droplet discharging data are prepared from layer data that is used for forming the insulating film and the transparent electrode. Based on these groups of data, the second discharging head then discharges liquid droplet containing insulating film material, and the third discharging head discharges liquid droplet containing transparent electrode material.

In this manner, when the discharging head group is provided with the first, the second, and the third discharging head, and separate discharges of liquid droplet are made using these discharging heads, it is possible to form a pattern that is made up of a plurality of functional layers.

It is possible that: a plurality of liquid droplet discharging units each having the discharging heads is provided; and each of the plurality of liquid droplet discharging units discharges the liquid droplet independently for each of the plurality of functional layers.

A description is given of when a pattern is formed using, for example, a first liquid droplet discharging unit that discharges liquid droplet containing a metal material, a second liquid droplet discharging unit that discharges liquid droplet containing an insulating film material, and a third liquid droplet discharging unit that discharges liquid droplet containing a transparent electrode material. Firstly, when forming a functional layer that is made up of metal wiring on a substrate, bitmap data is prepared from layer data that is used for forming the metal wiring. Next, liquid droplet discharging data is prepared, and liquid droplet containing a metal material is discharged onto the substrate by the first liquid droplet discharging unit based on this liquid droplet discharging data. Next, when forming the functional layers of the insulating film and transparent electrode, in the same way as is described above, groups of liquid droplet discharging data are prepared from layer data that is used for forming the insulating film and the transparent electrode. Based on these groups of data, liquid droplet containing insulating film material is then discharged by the second liquid droplet discharging unit, and liquid droplet containing transparent electrode material is discharged by the third liquid droplet discharging unit. It is preferable that a transporting unit for transporting a substrate is placed between each of the first, second, and third liquid droplet discharging units.

In this way, when separate discharges of liquid droplet are made using the first, second, and third liquid droplet discharging units, it is possible to form a pattern that is made up of a plurality of functional layers.

It is possible that: the layer data includes film thickness data that specifies film thicknesses of the functional layers; and the CAD data preparing device includes a setting device that sets a number of discharges of the liquid droplet that is discharged from the discharging heads and a discharging quantity of the liquid droplet based on the film thickness data.

The "setting device" sets the number of discharges and the discharge quantity of liquid droplet after the proportions of the materials for the functional layers that are contained in the liquid droplet have been adjusted and after changes in the nature and changes in the volume of the material that are caused by processing such as the drying processing and the like have been adjusted. For example, when forming metal wiring or the like, a method is employed in which a liquid that has been obtained by dispersing fine metal particles in a volatile solvent is discharged as liquid droplets. In this method, the number of discharges and the discharge quantities of the liquid droplet can be set after the content of the fine metal particles has been adjusted, and after changes in the nature and changes in the volume of the material that are caused by the drying processing and heat processing that are performed in order to precipitate out the fine metal particles have been adjusted.

If the above described method is employed, then it is possible to set the number of discharges of the liquid droplet and the discharge quantities of the liquid droplet by adjusting the content of material and the like contained in the liquid droplet that is further discharged based on the film thickness data.

DETAILED DESCRIPTION OF THE INVENTION

Figure 1:
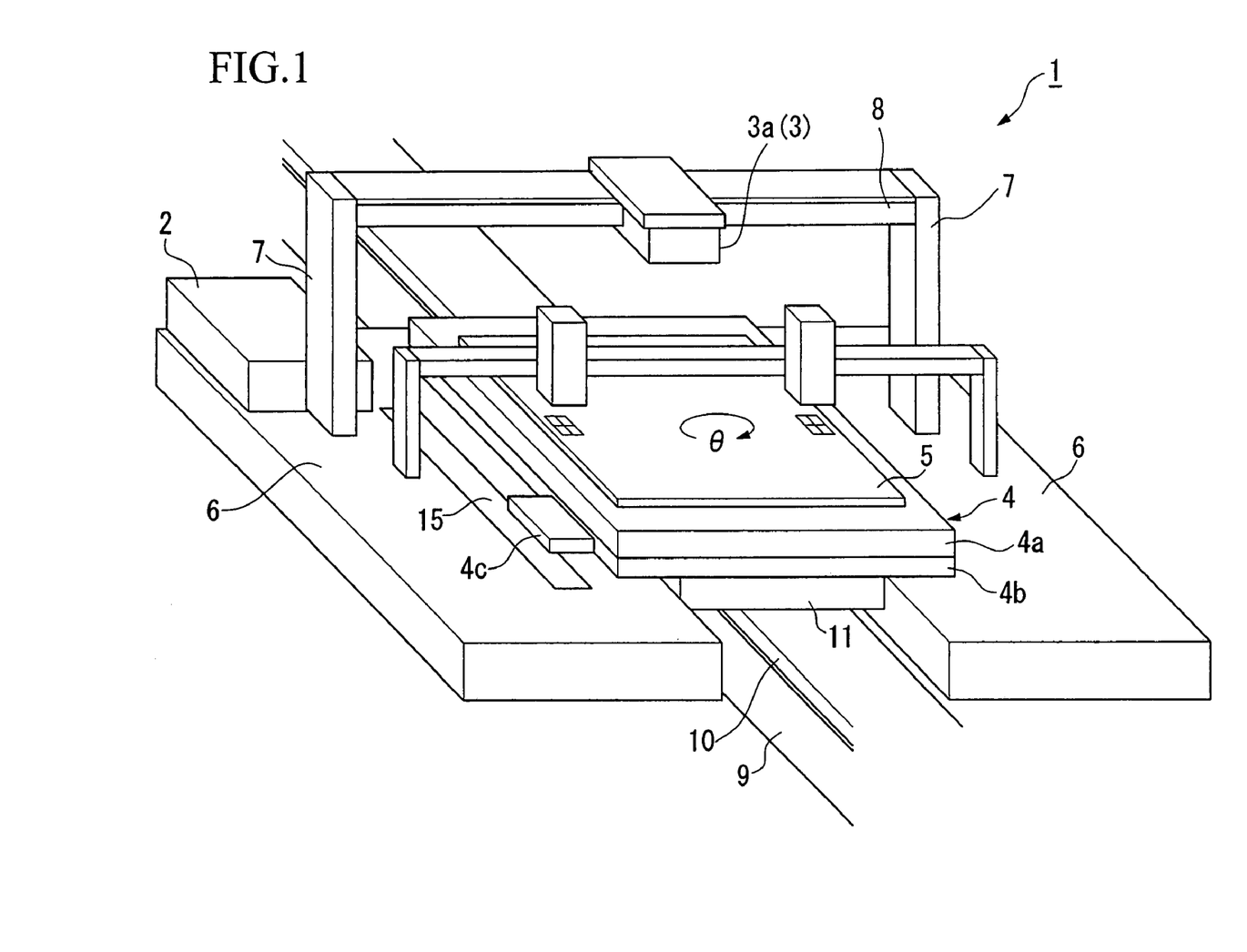
FIG. 1 is a perspective view showing the structure of the liquid droplet discharging apparatus of the present invention.

FIG. 1 is a perspective view showing the structure of the liquid droplet discharging apparatus according to an embodiment of the present invention.

As is shown in FIG. 1, the liquid droplet discharging apparatus 1 is provided with a control unit 2, a discharging head group 3, and a stage 4 as the main structural elements thereof.

In this type of liquid droplet discharging apparatus 1, as a result of the control unit 2 controlling operations of the discharging head group 3 and the stage 4, liquid droplets are discharged onto a substrate 5 that has been placed on the stage 4 so that a predetermined pattern is formed on the substrate 5.

Next, a description of the respective component elements will be given.

In the description given below, a direction of orientation of the discharging head group 3 is taken as the X direction, a direction in which the substrate 5 is transported is the Y direction, and an in-plane direction of rotation within the XY plane is taken as the θ direction.

The discharging head group 3 is formed by a plurality of discharging heads 3a that are arranged in a single row, and is provided so as to be able to move along an X direction shaft 8 that is constructed so as to extend in the X direction over the stage 4 between supporting columns 7 and 7 that stand vertically upright from a base 6. A large number of nozzles (for example, 180 nozzles may be formed in one row) that discharge liquid droplets are formed facing the substrate 5 in each discharging head 3a forming the discharging head group 3.

The discharging heads 3a are constructed so as to have a cavity that holds liquid droplets, nozzles that are connected to this cavity, and a liquid droplet discharging device that discharges liquid droplet held in the cavity from the nozzles in the form of liquid droplets. The liquid droplet discharging devices are formed by piezoelectric elements (i.e., piezo elements), and are provided in a wall surface of the discharging heads 3a. In a discharging head 3a that has been formed in this manner, as a result of a desired voltage waveform being supplied to the piezoelectric element, the wall surface of the discharging head 3a is deformed so that the volume inside the cavity changes and a predetermined quantity of liquid droplets are discharged from the nozzles. The voltage waveform that is supplied to the piezoelectric element is prepared on the basis of liquid droplet discharging data (described below).

The liquid droplet discharge device of the discharging heads 3a may be a device other than the aforementioned electromechanical converter that uses a piezoelectric element. For example, methods that may be employed include a method that uses a thermoelectric converter as an energy generator, an electrification control type or pressure vibration type of continuous method, an electrostatic absorption method, or a method in which heat is generated by the irradiation of an electromagnetic wave such as a laser, and liquid droplet is discharged by an action resulting from this heat generation.

Liquid droplet tanks that store a material liquid are connected to each of the plurality of discharging heads 3a via a flow passage of a pump or the like. By storing different types of material liquid in the respective liquid droplet tanks, it becomes possible to form different material liquids on a substrate from the respective discharging heads 3a. Namely, as a result of the selective use of each of the plurality of discharging heads 3a in the discharging head group 3, it becomes possible to discharge predetermined material liquids onto the substrate 5.

The above described discharging head group 3 is formed by a plurality of discharging heads 3a that are arranged in one row, however, the discharging head group 3 is not limited to this. For example, it is also possible to arrange two rows of discharging heads 3a that are staggered in the X direction by half a pitch relative to the spacing between (i.e., the pitch of) nozzles of each discharging head 3a. If a large number of rows of discharging heads 3a are provided, liquid droplets can be discharged at a spacing that is less than the spacing between nozzles.

It is also possible for the discharging heads 3a to be inclined at a predetermined angle relative to the X direction. In this case as well, liquid droplets can be discharged at a spacing that is less than the spacing between nozzles.

The stage 4 is formed by a placement portion 4a that is provided with pins or the like (not shown) on which the substrate 5 is placed and precisely positioned, a base portion 4b that is connected so as to be able to rotate the placement portion 4a within the XY planes. An encoder 4c is provided on the base portion 4b. The encoder 4c reads a scale of a linear scale 15 that is provided extending in the Y direction of the base 6, thereby enabling the position of the stage 4 in the Y direction to be detected.

The stage 4 is constructed so as to be able to move along a Y direction shaft 9 that is provided so as to be orthogonal to the X direction. An example of a transporting mechanism to move the stage 4 in the Y direction is a linear motor that is formed by a permanent magnet 10 that is located above the Y direction shaft 9 and a plurality of coils (not shown) that extend in the Y direction on a plate 11 that is fixed to the bottom side of the base portion 4b of the stage 4 and that are also placed adjacent to the permanent magnet 10.

The substrate 5 is the subject on which a pattern is formed in the present embodiment. The material of the substrate 5 may be a transparent substrate such as glass, however, if transparency is not required, metal plate or the like may be used. Both the length and width of the substrate 5 exceed 1 m in size.

Examples of the pattern that is formed on the substrate 5 include a pixel pattern formed by color filters having RGB colors, and metal wiring and the like when a TFT circuit is being formed.

The control unit 2 is connected electrically to each component element of the above described liquid droplet discharging apparatus 1, and may be what is commonly known as a computer to which a central processing unit (CPU), ROM, RAM, input and output interfaces, oscillation circuits and the like are connected via a bus. A control unit 2 such as this performs the integrated control of the liquid droplet discharging apparatus 1 in accordance with a program that has been input in advance.

Next, the structure of the control unit 2 will be described in detail with reference made to FIG. 2.

Figure 2:
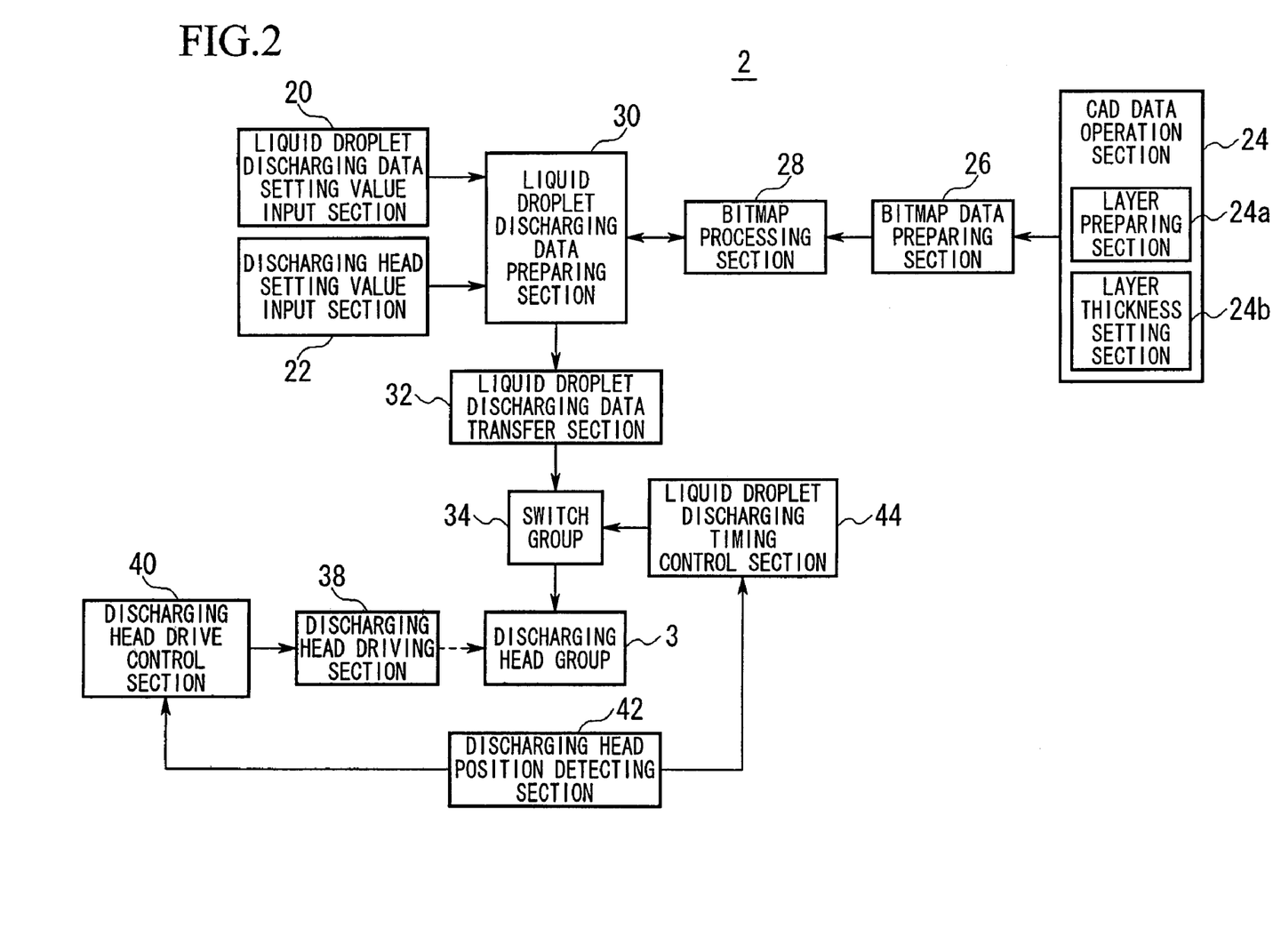
FIG. 2 is a block diagram describing functions of a control unit of the liquid droplet discharging apparatus of the present invention.

FIG. 2 is a block diagram describing the functions of the control unit 2.

As is shown in FIG. 2, the control unit 2 has a liquid droplet discharging data setting value input section 20, a discharging head setting value input section 22, a CAD data operations section (i.e., a CAD data preparing device) 24, a bitmap data preparing section (i.e., a bitmap data preparing device) 26, a bitmap processing section 28, a liquid droplet discharging data preparing section (i.e., preparing device) 30, a liquid droplet discharging data transfer section 32, a switch group 34, a head driving section 38, a head drive control section 40, a head position detecting section 42, and a liquid droplet discharge timing control section 44.

The liquid droplet discharging data setting value input section 20 has the functions of setting the dimensions of the substrate 5, setting the dimensions of chips in order for the substrate 5 to be cut into a plurality of chips, setting the pitch between adjacent chips, setting pixel layout (i.e., pattern), setting the number of pixels, setting pixel dimensions (i.e. the horizontal and vertical sizes of the pixels), and setting the pitch between adjacent pixels.

The discharging head setting value input section 22 has the functions of setting the quantity of liquid droplets required to form the pixels, setting the number of passes of the substrate 5 and discharging head group 3 required to form the pixels, setting the number of the aforementioned discharging heads 3a of the discharging head group 3 to be used, and setting the placement of the discharging heads 3a.

The CAD data operations section 24 has the function of creating CAD data that forms the design drawing of the pattern to be formed on the substrate, and is formed by an input device used for inputting drawing information (i.e., vector data and data on the attributes of the drawings and the like), and a workstation or the like having a drawing processing function. The CAD data operations section 24 has a layer preparing section 24a and a layer thickness setting section (i.e. setting device) 24b.

When the pattern is a laminated structure that is formed by laminating a plurality of layers (i.e., functional layers), the layer preparing section 24a has the function of preparing layer data for each layer as a portion of the CAD data. The layer thickness setting section (i.e., setting device) 24b sets the film thickness of these layers, and also has the function of setting the discharge quantity of liquid droplets and the number of discharges of liquid droplets that are discharged from the discharging heads 3a.

The bitmap data preparing section 26 has the function of preparing bitmap data in accordance with each layer based on the CAD data having the aforementioned layers.

The bitmap processing section 28 performs processing to alter the bitmap data prepared by the bitmap data preparing section 26 in accordance with the number and placement of the discharging heads or with the need to narrow the line width of the circuit pattern in consideration of the impact diameter of the liquid droplets on the substrate.

The liquid droplet discharging data preparing section 30 prepares droplet discharging data (i.e., binary time series data) in consideration of the impact diameter when the liquid droplets impact on the substrate so that a predetermined pattern size is obtained. This liquid droplet discharging data includes recorded data of the number of dots that corresponds to the number of the respective liquid droplet discharge devices that are provided to correspond to the number of respective liquid droplet discharge devices that are provided to correspond to the respective nozzles of the discharging head group 3.

The liquid droplet data transfer section 32 has the function of transferring liquid droplet discharging data output from the liquid droplet discharging data preparing section 30 to the liquid droplet discharge devices of the discharging head group 3.

The switch group 34 is provided between the liquid droplet discharging data transfer section 32 and the discharging head group 3, and is formed by a plurality of switches that are connected one-on-one to each of the plurality of drive sections included in the discharging head group 3, and that are set in an ON or OFF state by the recorded data transferred from the liquid droplet discharging data transfer section 32.

The head driving section 38 is integrated with the discharging head group 3. The head driving section 38 may, for example, be a linear motor, and moves the discharging head group 3 in an orthogonal direction relative to the transporting direction of the substrate 5.

The head drive control section 40 performs drive control of the head driving section 38 based on instructions from a system host controller (not shown).

The head position detecting section 42 has the function of detecting the amount of displacement of the position of the stage 4 to which the substrate 5 is fixed, namely, of detecting the relative position of the discharging head group 3 above the substrate 5. This head position detecting section equates to the aforementioned encoder 4c.

The liquid droplet discharge timing control section 44 supplies drive signals to each of the plurality of drive sections at timings that are based on detection outputs from the head position detecting section 42.

Next, the operation of the liquid droplet discharging apparatus (i.e., the liquid droplet discharging method) according to the present embodiment will be described with reference made to FIG. 3, FIG. 4, and FIGS. 5A to 5C.

Figure 3:
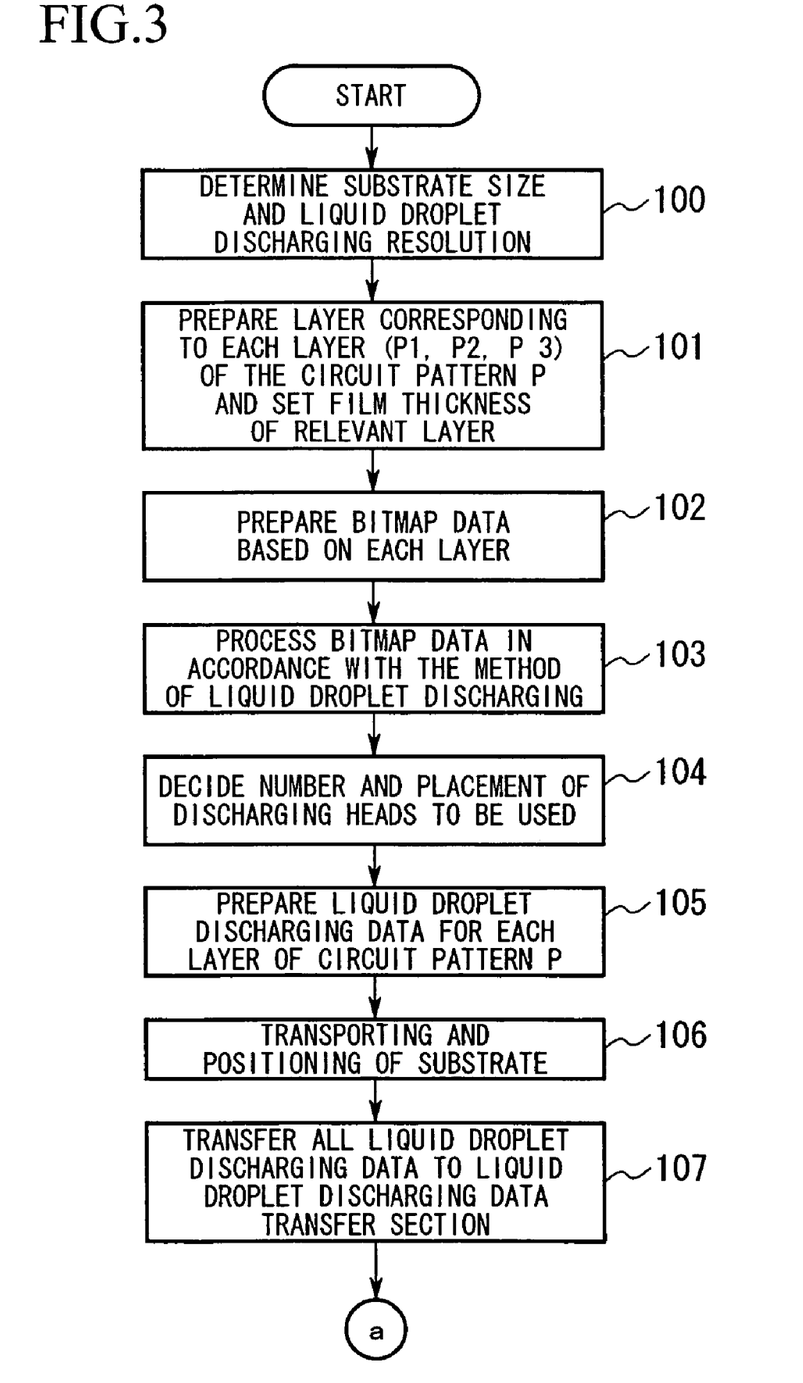
FIG. 3 is a flow chart for forming pixels using the liquid droplet discharging apparatus of the present invention.
Figure 4:
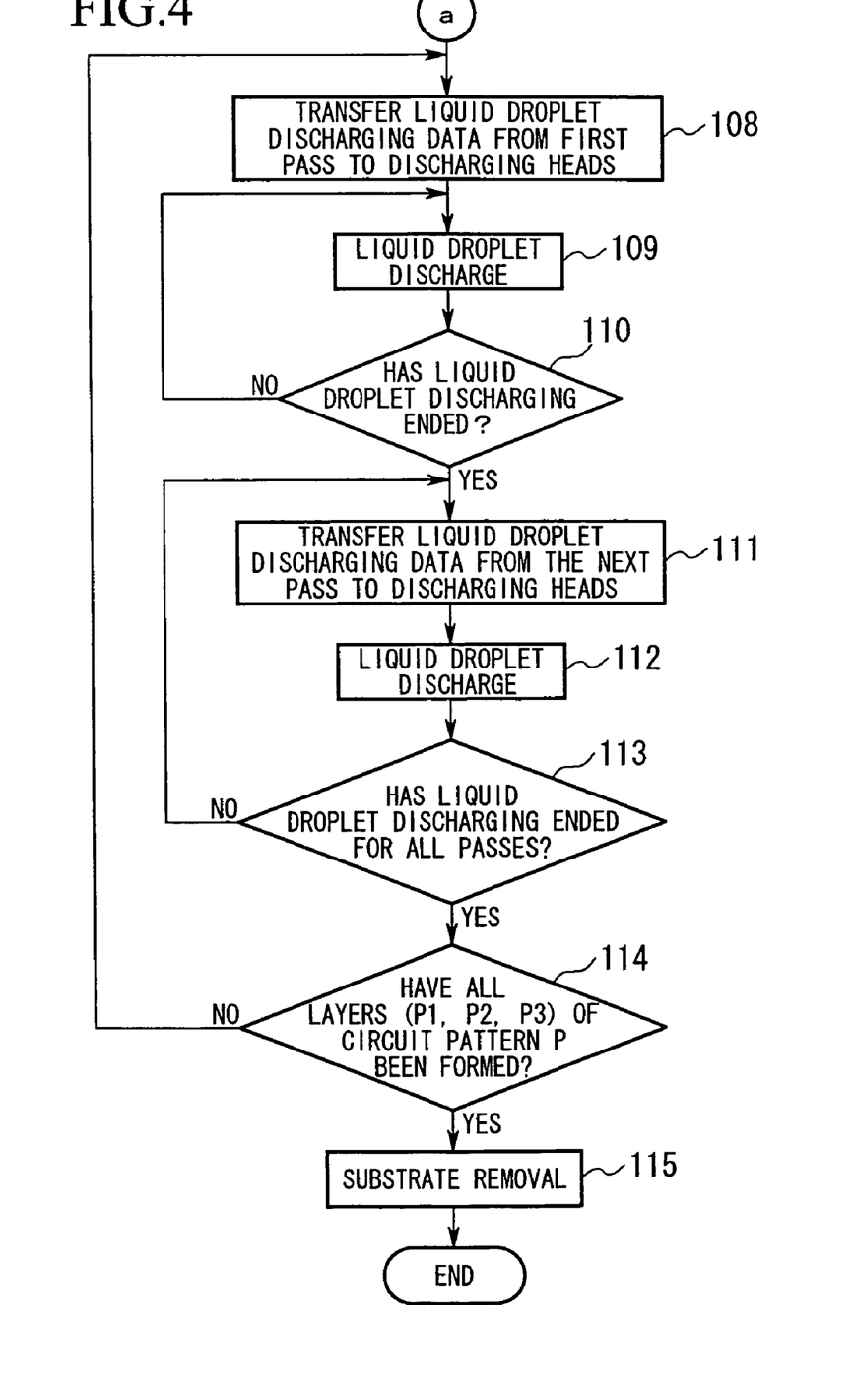
FIG. 4 is a flow chart that continues on from the flow chart shown in FIG. 3.
Figure 5A:
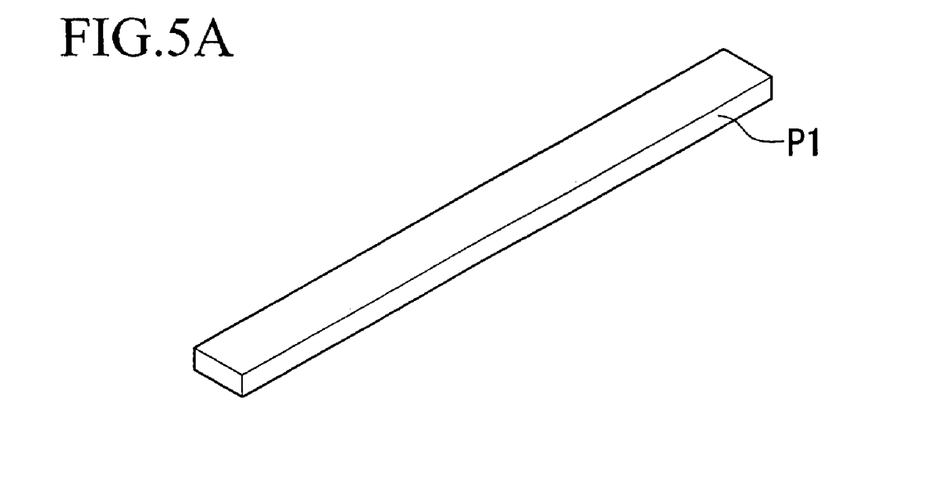
FIGS. 5A to 5C are perspective views showing a circuit pattern formed using the liquid droplet discharging method of the present invention.
Figure 5B:
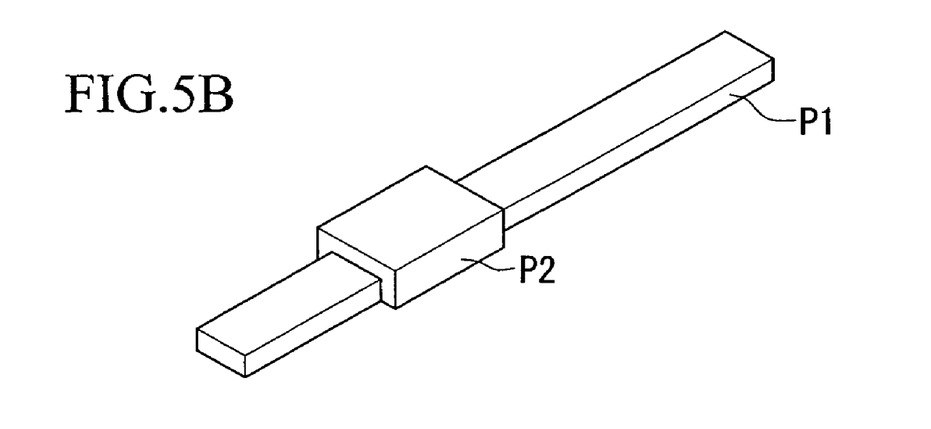
Figure 5C:
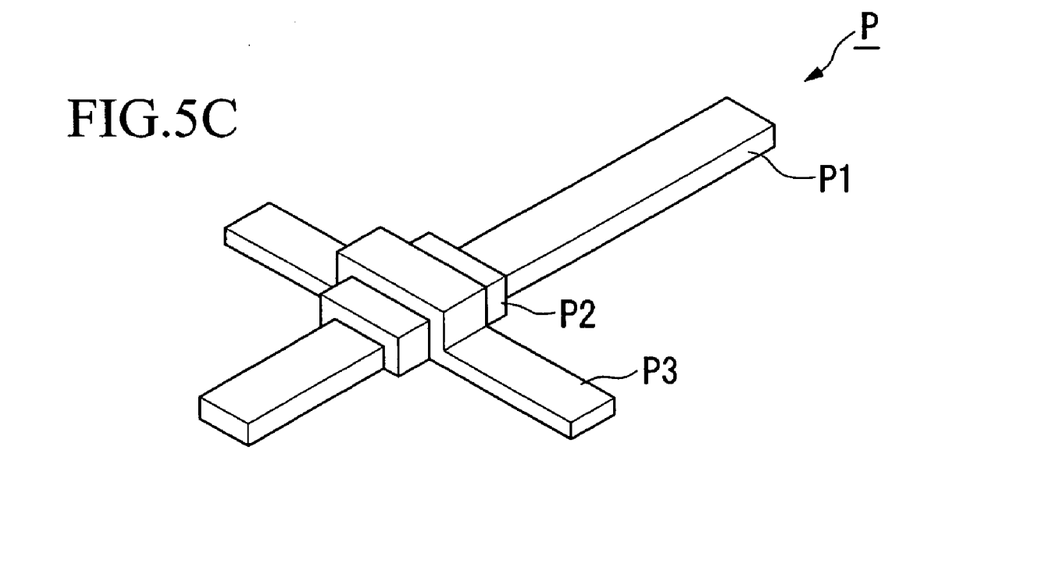

FIG. 3 and FIG. 4 are flowcharts showing the formation of a circuit pattern on the substrate 5. FIGS. 5A to 5C are perspective views showing a circuit pattern formed in the present embodiment. FIGS. 5A to 5C are views showing the process by which a circuit pattern is formed.

As is shown in FIG. 5C, a circuit pattern (i.e., a pattern) P is formed by conductive wires (i.e., functional layers) P1 and P3, and by an insulating film (i.e., a functional layer) P2. A material liquid containing fine metal particles or the like is used for the formation of the conductive wires P1 and P3, while a material liquid containing an organic insulating material or the like is used for the formation of the insulating film P2. Discharging heads 3a that discharge each of these material liquids are placed in the discharging head group 3.

Next, the liquid droplet discharging method in which a circuit pattern P is formed on the substrate 5 will be described based on the flowcharts shown in FIG. 3 and FIG. 4.

Firstly, the size of the substrate onto which liquid droplets are to be discharged and the liquid droplet discharge resolution are determined (step 100).

Next, CAD data of the circuit pattern P is output to the bitmap data preparing section 26 by the CAD data operations section 24 (step 101).

Step 101 will now be described in detail.

Firstly, each layer (i.e., P1, P2, and P3) constituting the circuit pattern P is prepared as a layer of CAD data by the layer preparing section 24a. In addition, the film thickness of this layer is set by the layer thickness setting section 24b. By setting the film thickness of the layer the discharge quantity of the liquid droplets and the number of discharges of liquid droplets that are discharged from the discharging head 3a is automatically set.

Next, the bitmap data preparing section 26 prepares respective bitmap data based on each layer of the CAD data, and outputs it to the liquid droplet discharging data preparing section 30 (step 102).

Next, the bitmap data processing section 28 processes the aforementioned bitmap data in accordance with the specifications of the liquid droplet discharge (step 103). Namely, in consideration of cases in which the nozzle pitch of the discharging head group 3 does not match the pixel pitch, or in which the required quantity of liquid droplets cannot be supplied in a single discharge, or in which if they are supplied in a single discharge the liquid droplets harden and the target pattern cannot be obtained, processing to alter the bitmap data is performed.

Next, the number and placement of the discharging heads of the discharging head group 3 to be used is decided and is input into the liquid droplet discharging data preparing section by the discharging head setting value input section 22 (step 104).

Next, in the liquid droplet discharging data preparing section 30, liquid droplet discharging data is prepared for each layer (i.e., P1, P2, and P3) of the circuit pattern P (step 105) based on the data input by the bitmap data processing section 28 and the discharging head setting value input section 22.

Next, the substrate 5 is transported by the transporting mechanism of the stage 4 and the head drive control section 40, and is precisely positioned (step 106).

Next, all the liquid droplet discharging data is transferred to the liquid droplet discharging data transfer section 32 (step 107).

In the liquid droplet discharging data transfer section 32, firstly, when forming the conductive wire P1, the liquid droplet discharging data from the first pass is transferred to the discharging head group 3 via the switch group 34 (step 108). Next, liquid droplets are discharged by the discharging head group 3 onto the substrate 5 that has been transported to a position facing the nozzles of the discharging head group 3 (step 109).

Next, a determination is made as to whether or not the liquid droplet discharge has ended for the first pass (step 110). If the determination in step 110 is negative, the routine moves back to step 109, and the above described processing is repeated. If, however, the determination in step 110 is positive, liquid droplet discharging data from the next pass is transferred to the discharging head group 3 via the switch group 34 (step 111). Next, liquid droplets are discharged by the discharging head group 3 onto the substrate 5, as is described above (step 112).

Next, a determination is made as to whether or not liquid droplet discharges have ended for all passes (step 113). If the determination in step 113 is negative, the routine moves back to step 111 and the above described processing is repeated. If, however, the determination in step 113 is positive, the conductive wire P1 is formed in the manner shown in FIG. 5A. Subsequently, a determination is made as to whether or not all the layers (i.e., P1, P2, and P3) of the circuit pattern P have been formed (step 114). If the determination in step 114 is negative, namely, if the insulating film P2 and the conductive wire P3 have not been formed, the routine moves back to step 108 and, by repeating the above described processing, the insulating film P2 and the conductive wire P3 are formed in the manner shown in FIG. 5B and FIG. 5C.

If the determination in step 114 is positive, namely, if all the layers (i.e., P1, P2, and P3) of the circuit pattern P have been formed, the substrate 5 is transported out so that it can be forwarded to other steps by the transporting mechanism of the stage 4 (step 115).

As is described above, when forming the circuit pattern P by the discharge of liquid droplets, it is possible to prepare the circuit pattern as CAD data. Moreover, by converting the prepared CAD data, bitmap data can be prepared. Furthermore, after creating liquid droplet discharging data based on this bitmap data, by making a discharge from the discharging heads onto a predetermined position on a substrate based on this liquid droplet discharging data, it is possible to form the circuit pattern P on the substrate 5.

In addition, it is possible to prepare a plurality of bitmap data based on the layers that constitute the CAD data. It is also possible to prepare a plurality of liquid droplet discharging data based on the plurality of bitmap data. Furthermore, by discharging liquid droplets based on this plurality of liquid droplet discharging data, it is possible to form a plurality of layers (i.e., P1, P2, and P3).

Moreover, as a result of the discharging head group 3 using discharging heads 3a for each different type of material liquid, and separately discharging this plurality of material liquids, it is possible to form a circuit pattern P made up of a plurality of layers (i.e., P1, P2, and P3).

Furthermore, it is possible to adjust the material content contained in liquid droplets subsequently discharged, and set the number of discharges of the liquid droplets as well as the discharge quantity of the liquid droplets based on the film thickness of the layers.

Next, another embodiment of the liquid droplet discharging apparatus of the present invention will be described.

Figure 6:
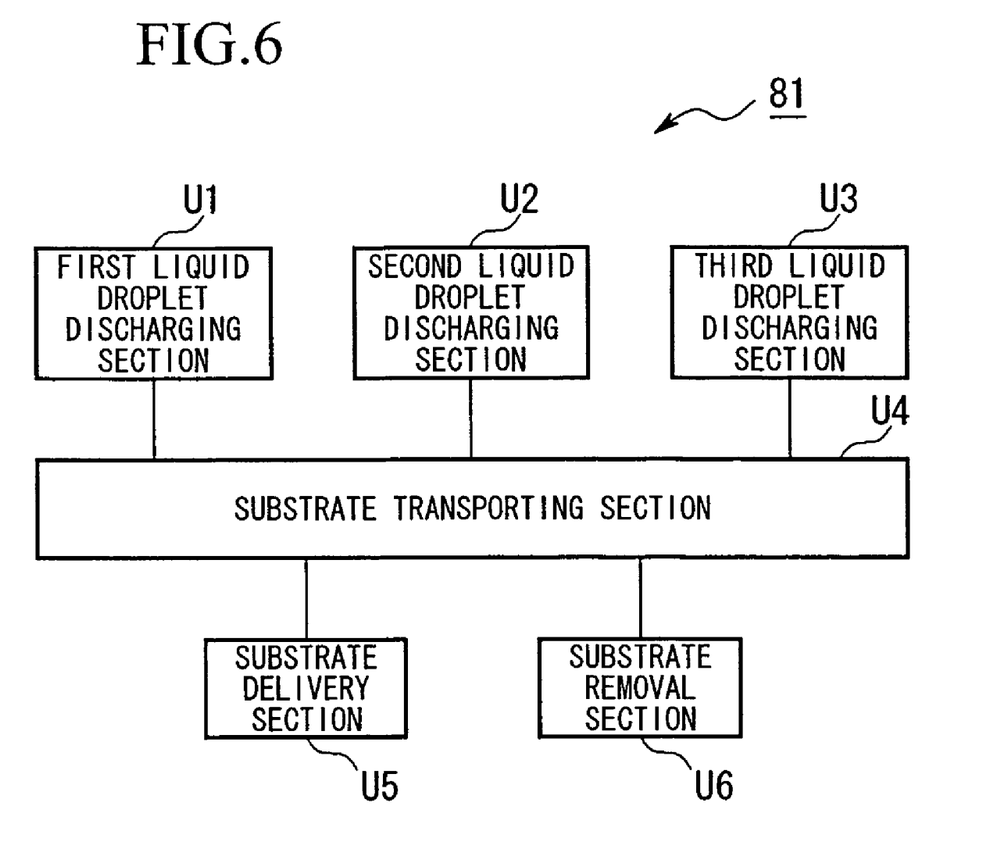
FIG. 6 is a structural view showing the structure of the liquid droplet discharging apparatus of the present invention.

FIG. 6 is a structural view showing the structure of a liquid droplet discharging apparatus.

In the present embodiment, a description of previously described structures and operations is omitted, and only those portions that differ from those of the above described embodiment are described.

As is shown in FIG. 6, a liquid droplet discharging apparatus 81 is provided with a first liquid droplet discharging section (i.e., liquid droplet discharging unit) U1, a second liquid droplet discharging section (i.e., liquid droplet discharging unit) U2, a third liquid droplet discharging section (i.e., liquid droplet discharging unit) U3, a substrate transporting section U4, a substrate delivery section U5, and a substrate removal section U6.

Each of the first liquid droplet discharging section U1, the second liquid droplet discharging section U2, and the third liquid droplet discharging section U3 is provided with a discharging head 3a for discharging a single type of material liquid in droplet form, a stage 4 for moving the discharging head 3a relatively to the substrate 5, and a control unit 2 for controlling the operations of each of these. The first and third liquid droplet discharge sections U1 and U3 respectively discharge droplets of different material liquids that contain fine metal particles for forming the conductive wires P1 and P3. The second liquid droplet discharge section U2 discharges droplets of a material liquid that contains an organic insulating material or the like for forming the insulating film P2. Accordingly, as a result of each of the liquid droplet discharging sections U1, U2, and U3 discharging liquid droplets, the conductive wires P1 and P3 and the insulating film P2 are formed, and ultimately the circuit pattern P is formed on the substrate 5.

The substrate transporting section U4 transports a substrate 5 delivered from the substrate delivery section U5 to each of the liquid droplet discharge sections U1, U2, and U3, and ultimately removes the substrate 5 on which the circuit pattern P has been formed from the substrate removal section U6.

A liquid droplet discharging method that uses the liquid droplet discharging apparatus 81 will now be described.

Firstly, the substrate transporting section U4 transports a substrate 5 from the substrate delivery section U5 to the first liquid droplet discharging section U1. In this first liquid droplet discharging section U1, by discharging a material liquid containing fine metal particles using the liquid droplet discharging method described above, the conductive wire P1 shown in FIG. 5A is formed.

Next, the substrate transporting section U4 transports the substrate 5 from the first liquid droplet discharging section U1 to the second liquid droplet discharging section U2. In the second liquid droplet discharging section U2, by discharging a material liquid containing an organic insulating material using the liquid droplet discharging method described above, the insulating film P2 shown in FIG. 5B is formed.

Next, the substrate transporting section U4 transports the substrate 5 from the second liquid droplet discharging section U2 to the third liquid droplet discharging section U3. In the third liquid droplet discharging section U3, by discharging a material liquid containing fine metal particles using the liquid droplet discharging method described above, the insulating film P3 shown in FIG. 5C is formed.

Next, the substrate transporting section U4 transports the substrate 5 from the third liquid droplet discharging section U3 to the substrate removal section U6.

As is described above, by performing separate droplet discharges using the respective liquid droplet discharging sections U1, U2, and U3, it is possible to form a circuit pattern P made up of a plurality of layers (i.e., P1, P2, and P3).

Next, a process to manufacture a liquid crystal display device using the liquid droplet discharging method of the present invention will be described in detail.

Figure 7A:
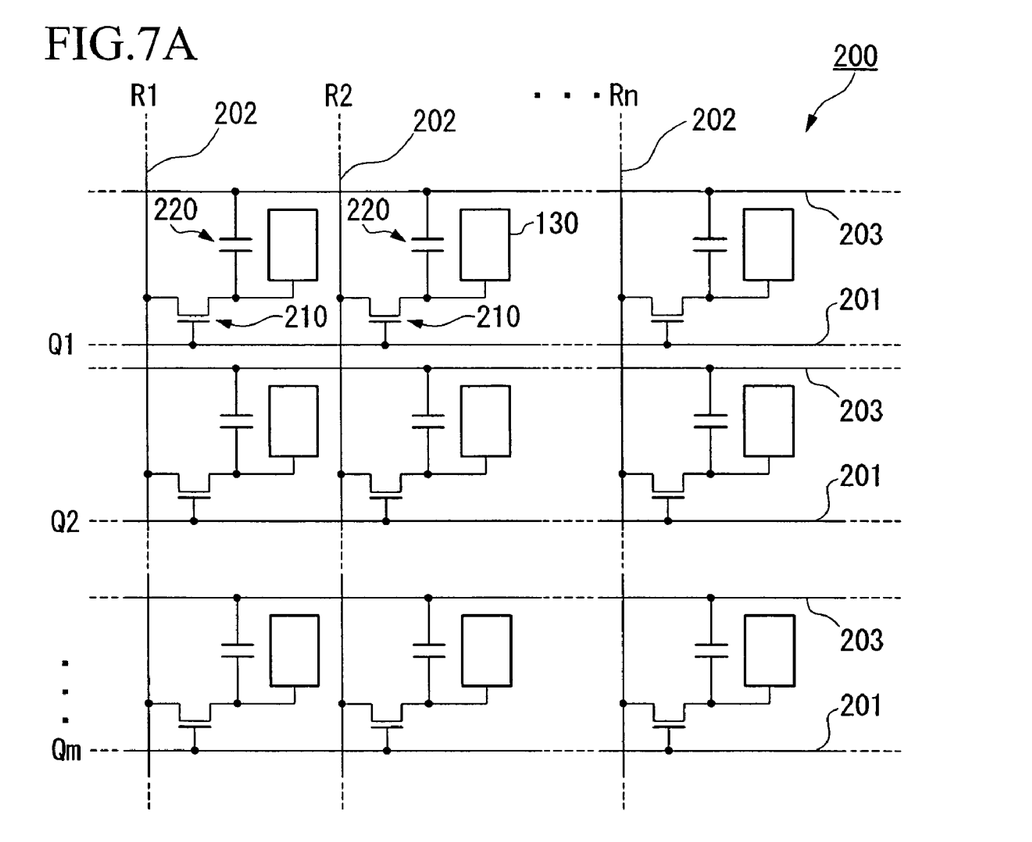
FIGS. 7A and 7B are a views showing a liquid crystal display device formed using the liquid droplet discharging method of the present invention.
Figure 7B:
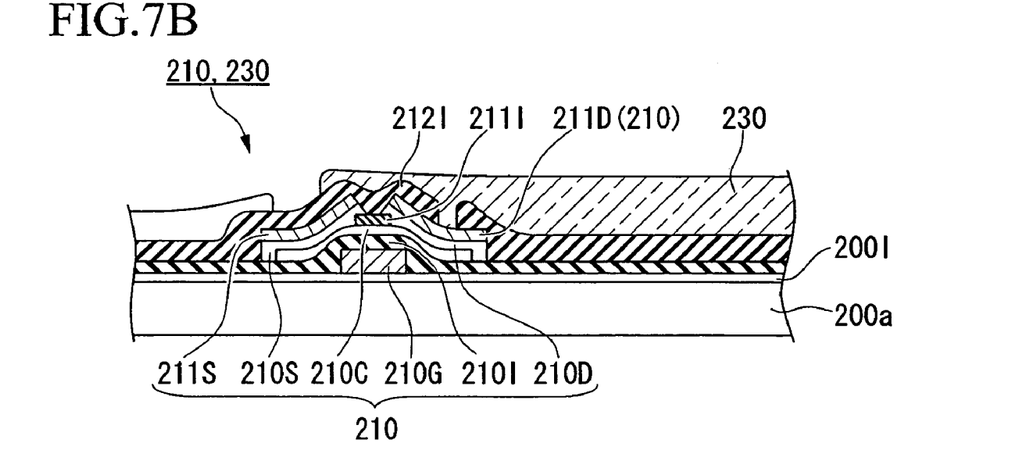

FIGS. 7A and 7B are views describing a liquid crystal display device. FIG. 7A shows equivalent circuits of various types of elements and wiring and the like such as switching elements that constitute an image display area of a liquid crystal display device. FIG. 7B shows principal portions of a liquid crystal display device, and is a perspective view for describing the structure of pixel electrodes and switching elements provided in each pixel.

In the description given below, a description of previously described structure and operations is omitted, and only those portions that are different are described.

Firstly, a liquid crystal display device formed using the liquid droplet discharging method of the present invention will be described.

As is shown in FIG. 7A, a liquid crystal display device 200 has a circuit pattern in which are formed a plurality of scan lines (i.e., a functional layer) 201 and data lines (i.e., a functional layer) 202 that are arranged in a matrix configuration, pixel electrodes (i.e., a functional layer) 230, and TFT (i.e., a functional layer) 210 used for pixel switching for controlling the pixel electrodes 230. The scan lines 201 receive the supply of scan signals Q1, Q2, . . . , Qm in pulses, while the data lines 202 receive the supply of image signals R1, R2, . . . , Rn. The scan lines 201 and the data lines 202 are connected to the TFT 210 as described below, and the TFT 210 a driven by the scan signals Q1, Q2, . . . , Qm and the image signals R1, R2, . . . , Rn. Storage capacitors (i.e., a functional layer) 220 that hold image signals R1, R2, . . . , Rn of a predetermined level for a fixed period are also formed, and capacitor wires (i.e., a functional layer) 203 are connected to the storage capacitors 220.

Furthermore, as is shown in FIG. 7B, the TFT 210 are TFT having what is known as a bottom gate type (i.e., a reverse stagger type) of structure. Specifically, this structure is formed by laminating in the following sequence an insulating substrate 200a that forms a base material of the liquid crystal display device 200, a foundation protective film (i.e., functional layer) 200I that is formed on a surface of the insulating substrate 200a, a gate electrode (i.e., functional layer) 210G, a gate insulating film (i.e., functional layer) 210I, a channel area (i.e., functional layer) 210C, and an insulating film (i.e., functional layer) 211I to protect the channels. A source area (i.e., functional layer) 210S and a drain area (i.e., functional layer) 210D are formed on both sides of the insulating film (i.e., functional layer) 211I. A source electrode (i.e., functional layer) 211S and a drain electrode (i.e., functional layer) 211D are formed on surfaces of the source and drain areas 210S and 210D.

Furthermore, an interlayer insulating film 212I and a pixel electrode (i.e., functional layer) 230, which is made up of a transparent electrode such as ITO are formed on the surface sides of the source electrode 211S and drain electrode 211D. The pixel electrode 230 is electrically connected to the drain electrode 211D via a contact hole.

The gate electrode 210G forms a portion of a scan line 201, while the source electrode 211S forms a portion of the data line 202.

Next, a method of manufacturing a circuit pattern of the liquid crystal display device 200 will be briefly described.

This circuit pattern prepares as CAD data a plurality of layers that correspond to each of the above described functional layers. The circuit pattern then prepares bitmap data from the CAD data and also prepares liquid droplet discharging data. In addition, the discharging heads 3a (i.e., the discharging head group 3) discharge liquid droplets based on this liquid droplet discharging data. A material that corresponds to each functional layer is used for the material liquid of these liquid droplets.

As has been described above, by employing the liquid droplet discharging method of the present invention, it becomes possible to form a pattern having a laminated structure.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as limited by the foregoing description and is only limited by the scope of the appended claims.

What is claimed is:

1. A liquid droplet discharging method in which discharging heads discharge liquid droplets onto a substrate while the discharging heads including a liquid droplet discharging device and the substrate are relatively moved, thereby forming a pattern onto the substrate, the liquid droplet discharging method comprising the steps of:

preparing a CAD data which is specified by a combination of a plurality of vector data, in accordance with a configuration of the pattern;

preparing a bit map data which specifies discharging positions of the liquid droplets using an XY matrix based on the CAD data;

preparing a liquid droplet discharging data used for discharging the liquid droplets based on the bitmap data; and changing the bitmap data.

2. The liquid droplet discharging method according to claim 1, wherein at the step of changing the bitmap data, the bitmap data is changed in accordance with a number of the discharging heads.

3. The liquid droplet discharging method according to claim 1, wherein at the step of changing the bitmap data, the bitmap data is changed in accordance with an arrangement of the discharging heads.

4. The liquid droplet discharging method according to claim 1, wherein at the step of changing the bitmap data, the bitmap data is changed in accordance with impact diameters of the liquid droplets on the substrate.

5. A liquid droplet discharging apparatus in which discharging heads discharge liquid droplets onto a substrate while the discharging heads including a liquid droplet discharging device and the substrate are relatively moved, thereby forming a pattern onto the substrate, the liquid droplet discharging apparatus comprising:

a CAD data preparing device which prepares a CAD data which is specified by a combination of a plurality of vector data, in accordance with a configuration of the pattern;

a bitmap data preparing device which prepares a bit map data which specifies discharging positions of the liquid droplets using an XY matrix based on the CAD data;

a liquid droplet discharging data preparing device which prepares a liquid droplet discharging data used for discharging the liquid droplets based on the bitmap data; and a bitmap processing section which performs a process for changing the bitmap data.

6. The liquid droplet discharging apparatus according to claim 5, wherein the bitmap processing section changes the bitmap data in accordance with a number of the discharging heads.

7. The liquid droplet discharging apparatus according to claim 5, wherein the bitmap processing section changes the bitmap data in accordance with an arrangement of the discharging heads.

8. The liquid droplet discharging apparatus according to claim 5, wherein the bitmap processing section changes the bitmap data in accordance with impact diameters of the liquid droplets on the substrate.

\* \* \* \* \*